(12) United States Patent
Ng et al.

(10) Patent No.: US 10,522,518 B2
(45) Date of Patent: Dec. 31, 2019

(54) LIGHT SOURCE WITH TUNABLE CRI

(75) Inventors: Keat Chaun Ng, Penang (MY); Bit Tie Chan, Pulau Pinang (MY); Kheng Leng Tan, Gelugor (MY)

(73) Assignee: Bench Walk Lighting, LLC, New York, NY (US)

( * ) Notice: Subject to any disclaimer, the term of this patent is extended or adjusted under 35 U.S.C. 154(b) by 631 days.

(21) Appl. No.: 12/977,512

(22) Filed: Dec. 23, 2010

(65) Prior Publication Data

US 2012/0162979 A1 Jun. 28, 2012

(51) Int. Cl.

| | |
|---|---|
| F21V 11/00 | (2015.01) |
| F21V 9/00 | (2018.01) |
| H01L 25/075 | (2006.01) |
| A01K 63/06 | (2006.01) |
| H01L 33/50 | (2010.01) |

(52) U.S. Cl.
CPC .......... *H01L 25/0753* (2013.01); *A01K 63/06* (2013.01); *H01L 33/504* (2013.01); *H01L 2224/32245* (2013.01); *H01L 2224/48091* (2013.01); *H01L 2224/48247* (2013.01); *H01L 2224/73265* (2013.01); *H01L 2224/8592* (2013.01); *H01L 2924/181* (2013.01)

(58) Field of Classification Search
CPC ........ F21Y 2101/02; F21K 9/00; F21S 10/02; F21S 4/001; H01L 25/0756; H01L 2924/181; H01L 33/504; H01L 25/0753; H01L 33/50
USPC ....................... 362/231, 227, 800; 257/89, 90
See application file for complete search history.

(56) References Cited

U.S. PATENT DOCUMENTS

| | | | |
|---|---|---|---|
| 6,229,713 B1 * | 5/2001 | Schmitt ................... | G06F 1/182 174/350 |
| 7,002,291 B2 | 2/2006 | Ellens et al. | |
| 7,242,033 B2 * | 7/2007 | Isokawa ............ | H01L 23/49838 257/100 |
| 7,350,933 B2 * | 4/2008 | Ng et al. ......................... | 362/84 |
| 7,573,189 B2 | 8/2009 | Juestel et al. | |
| 7,736,044 B2 | 6/2010 | Chew et al. | |
| 7,777,412 B2 * | 8/2010 | Pang ............................ | 313/506 |
| 7,786,557 B2 * | 8/2010 | Hsieh ................... | H01L 21/4832 257/673 |
| 7,847,303 B2 * | 12/2010 | Jung ................... | H01L 25/0753 257/89 |

(Continued)

FOREIGN PATENT DOCUMENTS

| | | |
|---|---|---|
| JP | 2008-270781 | 11/2008 |
| JP | 2009-111273 | 5/2009 |

*Primary Examiner* — Jong-Suk (James) Lee
*Assistant Examiner* — Eric T Eide
(74) *Attorney, Agent, or Firm* — Kim IP Group PLLC

(57) ABSTRACT

A light-emitting device with at least two light-emitting dies encapsulated with two different types of the wavelength-converting materials is disclosed. Each of the wavelength-converting materials is configured to produce a visible light from a narrow band light near UV region produced by the light-emitting dies, but with different correlated color temperatures (CCT) and different spectral contents. The combination of the two visible light forms the desired visible white light. The Color rendering index of the light-emitting device is tunable by adjusting the supply current to the light-emitting dies. In another embodiment, a light module with tunable CRI for an illumination system is disclosed.

17 Claims, 6 Drawing Sheets

(56) References Cited

U.S. PATENT DOCUMENTS

| | | | |
|---|---|---|---|
| 7,918,575 B2* | 4/2011 | Ho ............................. | F21K 9/00 |
| | | | 313/500 |
| 8,004,216 B2* | 8/2011 | Kayser ......................... | 315/312 |
| 8,084,934 B2* | 12/2011 | Kim et al. .................... | 313/501 |
| 8,247,825 B2* | 8/2012 | Ku ........................... | F21S 10/02 |
| | | | 257/88 |
| 8,348,457 B2* | 1/2013 | Kadotani et al. .............. | 362/231 |
| 8,368,112 B2* | 2/2013 | Chan et al. ..................... | 257/99 |
| 8,382,292 B2* | 2/2013 | Liu ................................. | 353/85 |
| 8,425,085 B2* | 4/2013 | Van Laanen .............. | F21V 3/02 |
| | | | 362/218 |
| 8,760,049 B2* | 6/2014 | Cha .................... | H01L 25/0753 |
| | | | 313/512 |
| 9,006,761 B2* | 4/2015 | Oyamada .............. | H01L 33/504 |
| | | | 257/301 |
| 2006/0245188 A1* | 11/2006 | Takenaka ............ | H01L 25/0753 |
| | | | 362/231 |
| 2009/0050912 A1* | 2/2009 | Chu ................... | H01L 25/0753 |
| | | | 257/89 |
| 2010/0090231 A1* | 4/2010 | Jung .................. | H01L 25/0753 |
| | | | 257/89 |

* cited by examiner

LIGHT SOURCE WITH TUNABLE CRI

BACKGROUND

A light-emitting diode (referred to hereinafter as LED) represents one of the most popular light-emitting devices today. In recent years, the luminous efficacy of LEDs, defined as lumens per Watt, has increased significantly from 20 lumens per Watt (approximately the luminous efficacy of an incandescent light bulb) to over 200 lumens per Watt, which greatly exceeds the luminous efficacy of a fluorescent light at 60 lumens per Watt. In other words, for a fixed amount of light output, LEDs consume only one third the power compared to fluorescent lights, and one tenth compared to incandescent light bulbs. Accordingly, it is not surprising today that lighting fixtures with LEDs is have recently been replacing incandescent light bulbs and fluorescent light tubes. A new term "Solid-State Lighting" has been created. The term "Solid-State Lighting" refers to the type of lighting that uses semiconductor light-emitting diodes, such as an LED rather than traditional light sources.

In the field of solid-state lighting, most of the light sources are white light. The white light sources may not be evaluated only in terms of luminous efficacy. Correlated color temperature (referred to hereinafter as CCT) and color rendering index (referred to hereinafter as CRI) may be other parameters that are widely used to compare and evaluate light sources. The CCT of a fight source indicates the relative color appearance of the particular light source on a scale from "warmer" (more yellow/amber) to "cooler" (more blue) light. CCT units are generally given in Kelvin or K. CCT is the color temperature of a theoretical black body radiator that to human color perception most closely matches the light from the lamp. For example, the CCT of a lit match may be approximately 1700K and the CCT of daylight may be approximately 6500K, whereas the CCT of a CRT monitor may be approximately 9000K.

On the other hand, the CRI is a quantitative measure of the ability of a light source to reproduce the colors of various objects faithfully in comparison with an ideal or natural light source. The CRI is calculated by comparing the color rendering of the test source to that of a theoretical "perfect" source, or a black body. CRI is a unit-less quantity. Higher CRI values correspond to better color rendering with a maximum value of 100, while lower values correspond to poorer color rendering with a minimum value of zero. Light sources with higher CRI values are desirable in color-critical applications, such as to photography. Depending on the application, the CRI goal is typically in the range of 75 to 95. For example, the CRI of an incandescent light bulb may be 100, but the CRI of a fluorescent tube may be 75. The CRI of most white LEDs may be less than 90.

Two light sources that have identical CCT values may render a given object's colors very differently, due to differences in the spectrum of the light, which is also referred to as spectral content. The CRI value of a light source is intended to capture the significance of such differences by denoting how accurately a particular light source renders the colors of illuminated objects. For example, a first light source comprising tri-colored RGB LEDs (red, green and blue light emitting diodes) and a second light source comprising a similar tri-colored RGB LEDs and an additional amber LED may be configured to produce a visible light having the same or substantially the same CCT value. However, the CRI of the first and second light sources may be different, because the spectral content of the two light sources are different.

One observation is that the light source having a more distributed spectrum may produce visible light with a higher CRI value. The spectrum of the first light source discussed above may include three narrow bands of waveforms peaking at or near the red, green and blue light regions, respectively. In contrast, the spectrum of the second light source discussed above may include four narrow bands of waveforms peaking at or near the red, amber, green and blue light regions, respectively. Accordingly, the second light source may be considered as being more distributed or "richer" compared to the first light source, and thus, having a higher CRI value. Similarly, a third light source comprising a blue light-emitting die that is covered with red phosphor may produce a similar visible light, but have a higher CRI value when compared to the first light source. This phenomenon may occur because the third light source may have a "richer" or more distributed spectrum. However, it will be appreciated that the computation of a CRI value involves several precise and complex mathematical steps. Thus, the CRI of any particular light source one cannot be arbitrarily predicted.

The spectral content of a light source is determined by the particular selection of light-emitting dies and phosphors or wavelength converting encapsulant materials utilized. There has been extensive research performed on the precise selection of light-emitting dies and the creation of phosphor recipes to produce white light sources with high CRI values. For example, a white light source produced utilizing a light-emitting die emitting blue light or ultra-violet (referred to hereinafter as UV) encapsulated with a mixture of yellow and red phosphor will produce white light with a high CRI value. The light-emitting die emitting blue light or ultra-violet light may be referred to as a near-UV light source. However, the CRI of such visible light sources may not be tunable. Once the light source leaves the manufacturing facility, the CRI of the light source is typically fixed.

In some applications, such as when a light source is being used for mood lighting or decorative lighting, a light source with a tunable CRI may be desirable, in order to change the atmosphere or mood in the environment for different times of day or occasions. For example, light sources with controllable CRI may be desirable in restaurants, bars, hotels, and shops, among other situations, in order to modify the lighting conditions of the tables, clothes racks, display cases, etc., according to the atmosphere, mood, time of day, season, or object to be illuminated. Similarly, a light source with a tunable CRI may be desirable for other applications, such as lighting for aquariums so that the lighting may produce different effects at different times of a day.

BRIEF DESCRIPTION OF THE DRAWINGS

Illustrative embodiments by way of examples, not by way of limitation, are illustrated in the drawings. Throughout the description and drawings, similar reference numbers may be used to identify similar elements.

DETAILED DESCRIPTION

Figure 1:
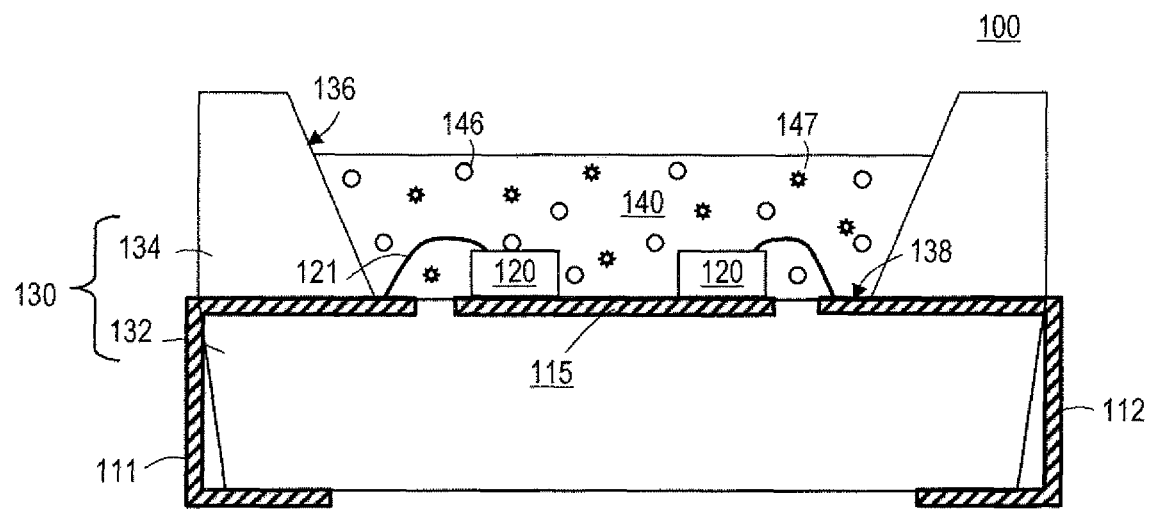
FIG. 1 illustrates a cross-sectional view of a light-emitting device using a mixture of yellow and red phosphor.

FIG. 1 illustrates a cross-sectional view of a light-emitting device 100. The light-emitting device 100 comprises a plurality of conductors 111-112, two light-emitting dies 120, a body 130 comprising a lower portion 132 and an upper portion 134, and a wavelength-converting material 140. The light-emitting device 100 may be known as a phosphor converted visible light source, as the light-emitting device 100 utilizes a wavelength-converting material 140, such as a phosphor to obtain visible light. The body 130 may be formed of an opaque to encapsulant that encapsulates at least a portion of the plurality of conductors 111-112. The lower portion 132 encapsulating the plurality of conductors 111-112 may be formed first prior to the upper portion 134, and thus, the lower portion 132 encapsulating the conductors 111-112 may be referred to as a substrate. The opaque encapsulant may be made of a plastic material, ceramic material, or any other similar materials. The body 130 may further define a side reflective surface 136 and a bottom reflective surface 138 that together form a reflector cup for directing light emitted by the light-emitting die(s) 120. A portion of the conductors 111-112 may be part of the bottom reflective surface 138.

One of the conductors may extend to form a die attach pad 115 adapted to receive the light-emitting dies 120. The light-emitting dies 120 may be near-UV light source dies, such as an InGaN die. The die attach pad 115 may be adapted to receive one, or more than one light-emitting dies 120. The light-emitting dies 120 may be connected to the plurality of conductors 111-112 via wire bonds 121. The light-emitting device 100 shown in FIG. 1 is a multiple die light source with two light-emitting dies 120. In another embodiment with a single die light source, only one light-emitting die 120 may be present. In yet another embodiment of a multiple die light source, the two light-emitting dies 120 may be attached to two different die attach pads 115. As shown in FIG. 1, the two light-emitting dies 120 may be connected to a common die attach pad 115. One of either the cathode or the anode of the two light-emitting dies 120 may be electrically connected through the die attach pad 115. When this is not desired, the two light-emitting dies 120 may be attached to two different die attach pads 115, not shown.

The light-emitting dies 120, the wire bonds 121, a portion of die attach pad 115, as well as a portion of the conductors 111-112 forming the bottom reflective surface 138 may be encapsulated by the wavelength-converting material 140. The wavelength-converting material 140 may be made by mixing two types of wavelength-converting components 146 and 147 into a transparent encapsulant, such as epoxy or silicon. In FIG. 1, the size of the wavelength-converting components 146 and 147 are shown much larger than actual size for illustration purposes. However, the actual size of the wavelength-converting components 146 and 147 are much smaller and invisible to the naked eye. The wavelength-converting components 146 and 147 may be two different types of phosphor, for example a yellow phosphor and a red phosphor. In another embodiment, two layers of wavelength-converting material 140 may be utilized. In such a situation, each layer of the wavelength-converting materials 140 may be formed by mixing one of the wavelength-converting components 146 and 147 into a transparent encapsulant.

Figure 2:
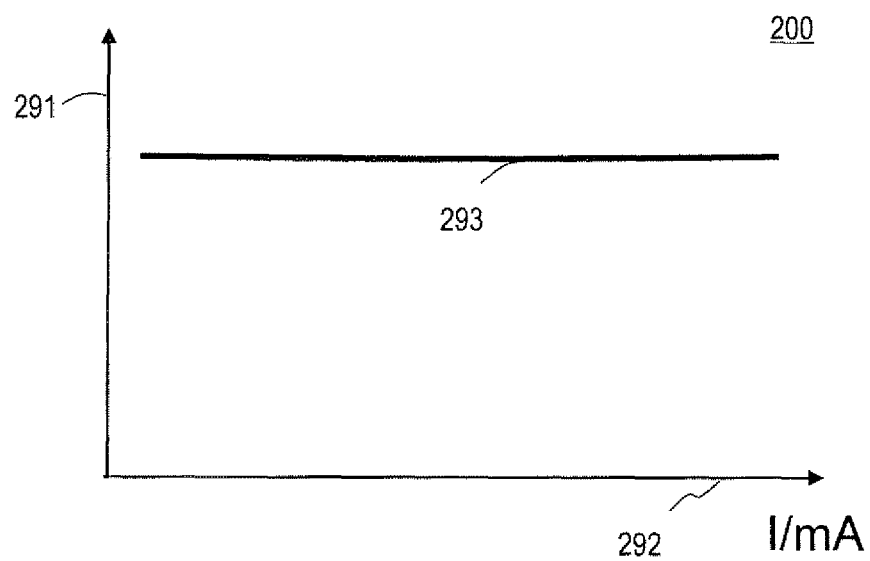
FIG. 2 illustrates an example of a CRI curve for the light-emitting device of FIG. 1 plotted against supply current.

Utilizing one type of wavelength-converting components 146 or 147 may be sufficient to obtain visible light. However, having two different wavelength-converting components 146 and 147, such as both yellow and red phosphor may produce a richer spectral content that may result in a higher CRI. Typically, the yellow phosphor may produce light output in the spectrums near the yellow, green and blue light regions, and the red phosphor may produce light output in the spectrums near the amber and red light regions, in order to yield a "richer" output spectral light. FIG. 2 illustrates an example of a CRI curve 200 for the light-emitting device 100 of FIG. 1 plotted against supply current. The Y-axis 291 represents the CRI and the X-axis 292 represents the supply current to the light-emitting dies 120. As illustrated in the graph, the CRI curve 293 remains constant even when supply current changes. When the supply current increases, the total brightness and CCT value may change, but the CRI will remain constant.

Figure 3:
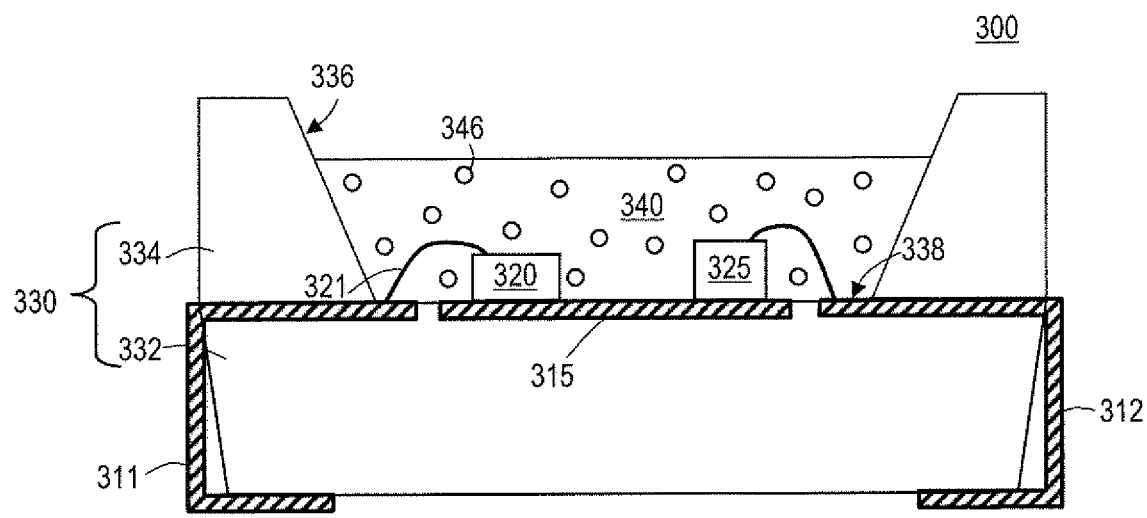
FIG. 3 illustrates a cross-sectional view of a light-emitting device using two different types of light-emitting dies.

FIG. 3 illustrates a cross-sectional view of a light-emitting device 300 using two different types of light-emitting dies 320 and 325. The light-emitting device 300 may comprise a plurality of conductors 311-312, a plurality of light-emitting dies 320 and 325, a body 330 comprising a lower portion 332 and an upper portion 334, and a wavelength-converting material 340. One of the conductors 311-312 may be extended to form a die attach pad 315. The upper portion 334 of the body 330 defines a side reflective surface 336 and a bottom reflective surface 338. The light-emitting dies 320 and 325, the wire bonds 321, as well as the portion of the conductors 311-312 forming the bottom reflective surface 338 may be encapsulated by the wavelength-converting material 340. The wavelength-converting material 340 may comprise a wavelength-converting component 346 and a transparent encapsulant such as epoxy or silicon.

The light-emitting device 300 is similar to the light-emitting device 100 with the exception of the following two points. First, the light-emitting device 300 comprises two different types of light-emitting dies 320 and 325, whereas the light-emitting device 100 in FIG. 1 comprises a single type of light-emitting dies 120. Second, the light-emitting device 300 comprises one type of wavelength-converting component 346, whereas the light-emitting device 100 in FIG. 1 comprises two different types of wavelength-converting components 146 and 147.

Typically, the light-emitting die 320 may be emitting light near the UV region. One possible candidate for the light-emitting die 320 may be an InGaN die. On the other hand, the light-emitting die 325 may be emitting light near the red visible light region. Possible candidates for light-emitting die 325 may be an AlInGaP die, a GaP die, a GaAs die or other similar die. The light emitted by the light-emitting die 325 may comprise more red spectrums, an effect that may be achieved through the red phosphor discussed in the embodiments of FIG. 1. The light-emitting device 300 shown in FIG. 3 may be configured to produce visible light having a similar CCT, but may be with a different CRI, compared to the light-emitting device of FIG. 1. By altering the supply current to each of the light-emitting dies 320 and 325, a visible light having the same CCT, but a different CRI value may be produced, as shown in FIG. 4.

Figure 4:
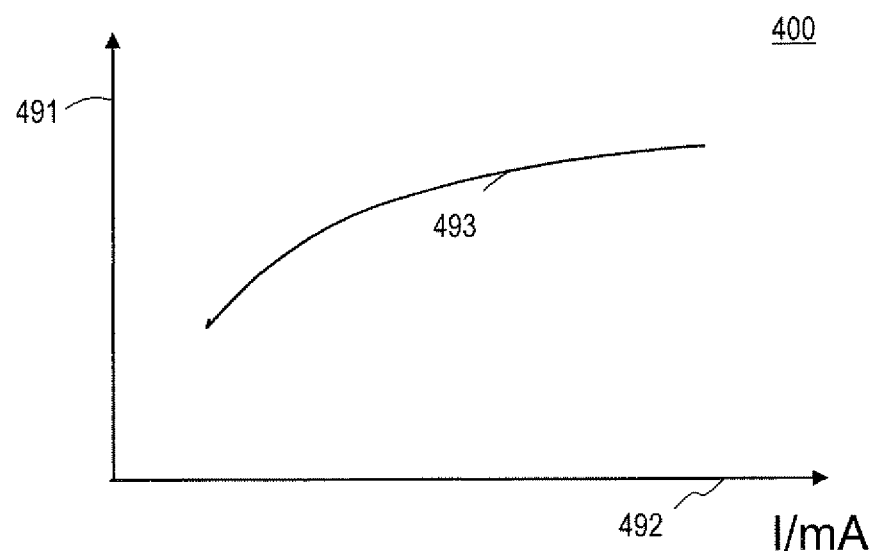
FIG. 4 illustrates an example of a CRI curve for the light-emitting device of FIG. 3 plotted against supply current.

FIG. 4 illustrates graph 400 for the light-emitting device 300 of FIG. 3 plotted against the supply current. The Y-axis 491 represents the CRI and the X-axis 492 represents the total supply current to both light-emitting dies 320 and 325. By increasing the supply current to the AlInGaP die, more light, particularly in the red spectrum may be produced, in order to enhance the CRT. However, in order to maintain color at a fixed CCT, the supply current to the other die 320 may be increased simultaneously according to a certain ratio. Thus, the CRI may stop increasing and become saturated, as illustrated by the curve 493 of FIG. 4. The graph 400 illustrates that the CRI of the light-emitting device 300 in FIG. 3 may be tunable by altering the supply current.

However, the light-emitting die 325, shown in FIG. 3, that emits light near the red visible light region, such as an AlInGaP die may have an issue with respect to thermal stability. The brightness efficiency of an AlInGaP die may drop significantly as the operating temperature increases. Moreover, the intensity and peak wavelength of the AlInGaP die may change when the operating temperature changes. This phenomenon may be a significant issue in certain applications in which the CRI and Intensity needs to be tightly maintained. One effective way to overcome this disadvantage is to use only one type of light-emitting die 320 that emits light near the UV region.

Figure 5:
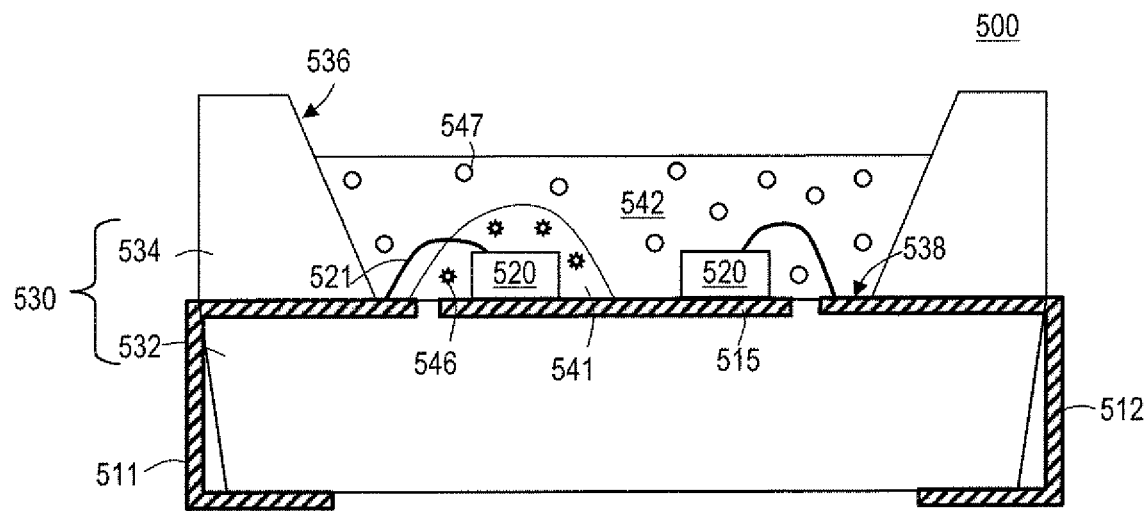
FIG. 5 illustrates a cross-sectional view of a lead frame based light-emitting device using at least two light-emitting dies encapsulated with two different wavelength-converting materials.

FIG. 5 illustrates a cross-sectional view of a lead frame based light-emitting device 500 using two light-emitting dies 520 that emit light near the UV region. The light-emitting device 500 may comprise a plurality of conductors 511-512, at least two light-emitting dies 520, a body 530 comprising a lower portion 532 and an upper portion 534, a first wavelength-converting material 541, and a second wavelength-converting material 542. The conductors 511-512 may be leads of a lead frame and one or more of the leads may be extended to form a die attach pad 515, adapted to receive the light-emitting dies 520. The lower portion 532 of the body 530 may be formed first in the manufacturing process, and therefore, may be referred to as a substrate. A portion of the body 530 and a portion of the conductors 511-512 may be made highly reflective to define a bottom reflective surface 538. The upper portion 534 of the body 530 may define a side reflective surface 536 that together with the bottom reflective surface 538 defines a reflector cup that is configured to direct light emitted by to the light-emitting dies 520 toward a specific direction. The light-emitting dies 520 may be connected electrically to the respective conductors 511-512 through wire bonds 521.

In FIG. 5, one of either the anodes or cathodes of the light-emitting dies 520 may be shorted together and the two light-emitting dies 520 may be attached to a common die attach pad 515. In another embodiment, where the electrical connections of each of the light-emitting dies 520 need to be separated, the two light-emitting dies 520 may be attached to two different die attach pads 515, not shown.

At least one of the light-emitting dies 520 may be encapsulated by a first wavelength-converting material 541 comprising a first wavelength-converting component 546, such as a red phosphor, suspended in a transparent encapsulant, such as an epoxy or silicon. The first wavelength-converting material 541 and the other of the two or more light-emitting dies 520 may be encapsulated by a second wavelength-converting material 542 comprising a second wavelength-converting component 547, such as a yellow phosphor, suspended within a transparent encapsulant, such as an epoxy or silicon. In FIG. 5, the wavelength-converting components 546-547 are shown much larger than the actual size. The wavelength-converting components 546-547 are usually invisible to the naked, unaided human eye.

Light emitted from the light-emitting die 520 encapsulated with the first wavelength-converting material 541 may be converted into a first visible light before entering the second wavelength-converting material 542. Light emitted from the light-emitting die 520 that is only encapsulated by the second wavelength-converting material 542 may be converted once into the second visible light. Usually the wavelength-converting material 541-542 will only have an effect on light having wavelength of less than 480 nm. Light near the UV region emitted by the light-emitting die 520 may be converted by the wavelength-converting materials 541-542 to visible light having more spectral components in the yellow and red regions.

In other words, while the light emitted from the light-emitting die 520 encapsulated only by the second wavelength-converting material 542 may be converted only once, the light emitted from the light-emitting die 520 encapsulated by the first wavelength-converting material 541 may be converted twice, first by the first wavelength-converting material 541, and then, by the second wavelength-converting material 542. However, the second conversion may not have any significant impact, because the yellow and red portion of the first visible light may not be converted further by the second wavelength-converting material 542. The blue portion of the first visible light may be converted further, but the amount of light being further converted may be relatively small.

The wavelength-converting components 546-547 may comprise different types of phosphor that are made up of a host and an activator. The host may be a crystalline material selected from or including a number of materials including oxides, sulfides, silicates, borates, and other elements including zinc, manganese, aluminium, silicone, calcium, magnesium, barium, strontium, cadmium, europium, cerium, lanthanum, gadolinium, and yitrium. The activator may be an intentionally added impurity that typically determines the wavelength of light emission. The activator may be a transition and rare earth metal. Therefore, the first and second wavelength-converting components 546-547 may differ in the composition of the activator.

In FIG. 5, the first wavelength-converting component 546 may be Nitride series red phosphor ((Sr,Ca)AlSiN3:Eu). The second wavelength-converting component 546 may be YAG series yellow phosphor (Y3Al5O12:Ce), Nitride series yellow phosphor (La3Si6N11:Ce), Silicate series yellow phosphor (Ca3(Sc,Mg)2Si3O12:Ce, BaMgAl10O17:Eu, (Sr-BaCa)2SiO4:Eu), or any other similar compositions.

In the embodiment shown in FIG. 5, both the light-emitting dies 520 may be InGaN dies. The light emitted by the light-emitting dies 520 may be near UV light and may have a wavelength between 300 nm and 480 nm. The first and second wavelength-converting materials 541-542 may be configured to transform the light emitted by the light-emitting dies 520 into a visible light. However, the visible light produced by the first and second wavelength-converting materials 541-542 may have different CCTs and a different spectrum, due to the use of different wavelength-converting components 546-547.

The light-emitting device 500 is similar to light-emitting device 100 except that the first and second wavelength-converting components 546 and 547 are separated into two different wavelength-converting materials 541-542, as shown in FIG. 5, whereas in FIG. 1, the light-emitting device 100 may only have one wavelength-converting material 140 containing two wavelength-converting components 146-147. The effect of separating the wavelength-converting components 546-547 in the manner done in the embodiment shown in FIG. 5 is that the CRI of the light-emitting device 500 is tunable, whereas the CRI of the light-emitting device 100 remains constant and non-tunable. The CRI curve of the light-emitting device 500 is similar to the CRI curve shown in FIG. 4.

The reason that CRI of the light-emitting device 500 is tunable may be for similar reasons that the light-emitting device 300, shown in FIG. 3, is tunable. Specifically, by increasing the supply current to the light-emitting dies 520 encapsulated by the first wavelength-converting material 541, the visible light component having more red spectrum may increase, and therefore, increase the CRI. This is similar to the light-emitting device 300, in which increasing the supply current to the light-emitting die 325 increases the red component of the spectrum, which subsequently increases the CRI. However, as the CCT needs to be maintained, the curve of the CRI may become saturated and become flat, as shown in the curve 493 and discussed in the discussions concerning FIG. 4.

Figure 6:
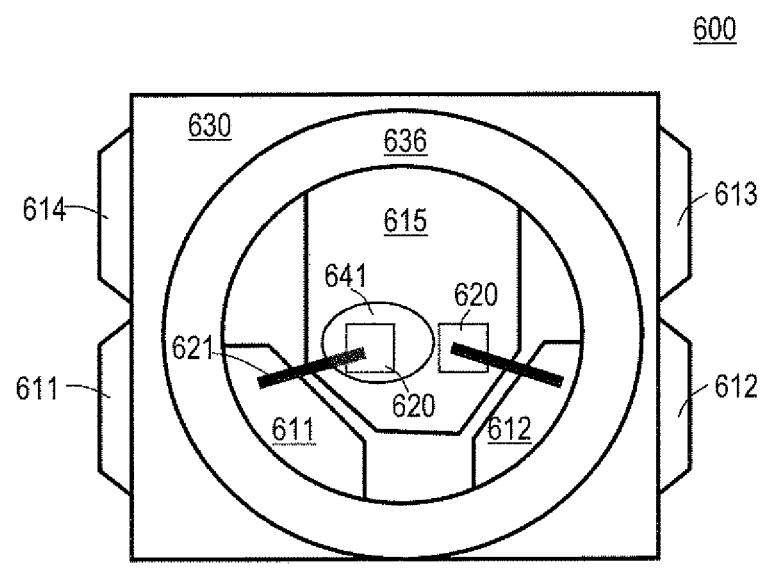
FIG. 6 illustrates a top view of the light-emitting device shown in FIG. 5.

FIG. 6 illustrates a top view of a light-emitting device 600, which is similar to the light-emitting device 500, but shown without the second wavelength-converting material 542, shown in FIG. 5. As shown in FIG. 6, the light-emitting device 600 has a plurality of conductors 611-614. One of the conductors 614 may be extended to form the die attach pad 615. A portion of the conductors 611, 612, 615 and a portion of the body 630 may define a bottom reflective surface that is similar to the bottom reflective surface 538 in FIG. 5. Another portion of the body 630 may define side reflective surface 636. The side reflective surface 636 and the bottom reflective surface may together define a reflector cup. One of either the cathode or anode of the light-emitting dies 620 may both be electrically connected to the die attach pad 615, which is electrically connected to the conductor 614. The other end of the anode or cathode of the light-emitting dies 620 may be connected to the conductors 611-612, respectively, through wire bonds 621.

Figure 7:
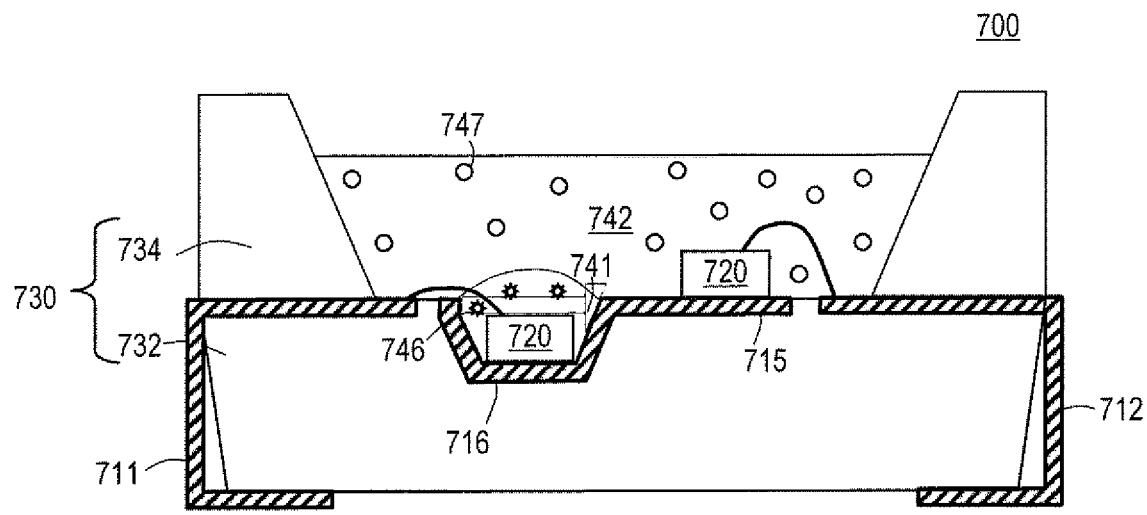
FIG. 7 illustrates a cross-sectional view of a light-emitting device with the die attached pad defining a hollow.

FIG. 7 illustrates a cross-sectional view of another light-emitting device 700. The light-emitting device 700 comprises a plurality of conductors 711-712, at least two light-emitting dies 720, a body 730 comprising a lower portion 732 and an upper portion 734, a first wavelength-converting material 741 and a second wavelength-converting material 742. Similar to the light-emitting device 500, the first wavelength-converting material 741 comprises a first wavelength-converting component 746, such as a red phosphor configured to produce visible light having more spectrum near the red light region. The second wavelength-converting material 742 comprises a second wavelength-converting component 747, such as a yellow phosphor configured to obtain visible light having less spectrum near the red light region.

The light-emitting device 700 shown in FIG. 7 is similar to the light-emitting device 500 except that the die attached pad 715 defines a hollow 716 adapted to receive one of the light-emitting dies 720 and the first wavelength-converting material 741. In a lead frame package, the hollow 716 may be made by stamping, forming or bending the lead frame. The hollow 716 of the light-emitting device 700 enables the light-emitting die 720 and the first wavelength-converting material 741 to be placed at a position lower than the other light-emitting die 720 and the second wavelength-converting material 742 to ensure a more thorough light mixing.

Figure 8:
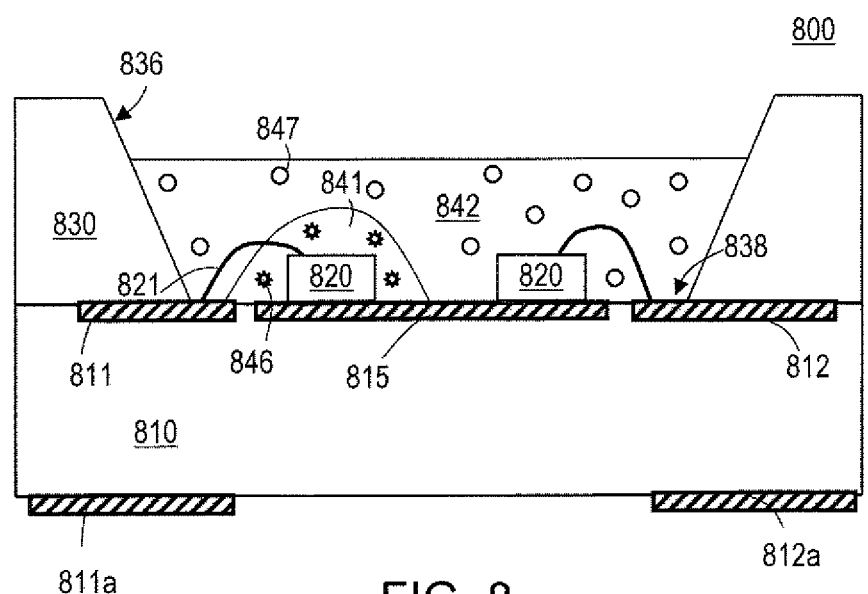
FIG. 8 illustrates a cross-sectional view of a printed circuit board based light-emitting device.

FIG. 8 illustrates a cross-sectional view of a printed circuit board based light-emitting device 800. The light-emitting device 800 comprises a substrate 810, a plurality of conductors 811-812 located at the substrate 810, at least two light-emitting dies 820, a body 830, a first wavelength-converting material 841 and a second wavelength-converting material 842. The substrate 810 may be a printed circuit board (referred to hereinafter as PCB). The conductors 811-812 may be known as traces of the PCB. The body 830 may further define a side reflective surface 836, whereas the substrate 810 and traces 815 may define a bottom reflective surface 838. The light-emitting dies 820 may be attached to a die attached pad 815. The light-emitting dies 820 may be electrically connected to the plurality of the conductors 811-812 and the die attach pad 815 via wire bonds 821. The conductors 811-812 may be electrically connected to solder pad 811a-812a on the bottom surface of the PCB for electrical connection to external power source (not shown).

One of the light-emitting dies 820 may be encapsulated by a first wavelength-converting material 841 comprising a transparent encapsulant and a first wavelength-converting component 846, such as a red phosphor. The other light-emitting die 820 and the first wavelength-converting material 841 may be encapsulated by a second wavelength-converting material 842 comprising a transparent encapsulant and a second wavelength-converting component 847, such as a yellow phosphor similar to the light-emitting device 500 shown in FIG. 5. In general, light-emitting device 800 may be similar to the light-emitting device 500 shown in FIG. 5 except that the light-emitting device 800 is based on a PCB, whereas the light-emitting device 500 is based on a lead frame package.

Figure 9:
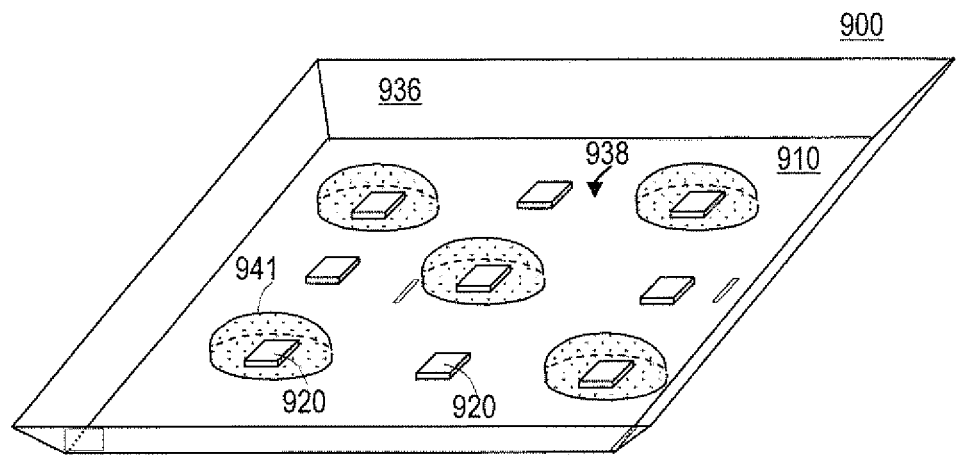
FIG. 9 illustrates an isometric view of a light module using two groups of light-emitting dies encapsulated by two different wavelength-converting materials.

FIG. 9 illustrates a top, isometric view of a light module 900 during manufacturing, and before the step of encapsulating a second wavelength-converting material. The light module 900 may be a part of an illumination system having a light controller (not shown) and feedback system (not shown). The light module 900 comprises a substrate 910, a plurality of light-emitting dies 920, a first wavelength-converting material 941, a second wavelength-converting material (not shown), a side reflective wall 936, and a bottom reflective surface 938. The substrate 910 may be a PCB configured to provide electrical connection to each of the light-emitting dies 920. A portion of the substrate 910 may be made highly reflective to define the bottom reflective surface 938.

The light-emitting dies 920 may be separated into two different groups and arranged in an alternating grid. The first group of the light-emitting dies 920 may be encapsulated by a first wavelength-converting material 941, similar to the light-emitting device 500, shown in FIG. 5. The second group of the light-emitting dies 920, together with the first wavelength-converting material 941 may be encapsulated by a second wavelength-converting material (not shown) similar to the light-emitting devices 500 shown in FIG. 5. The light module 900, shown in FIG. 9, needs to go through a further process step of encapsulating the bottom reflective surface 938, the first wavelength-converting material 941, and the second group of the light-emitting dies 920 with the second wavelength-converting material (not shown).

Figure 10:
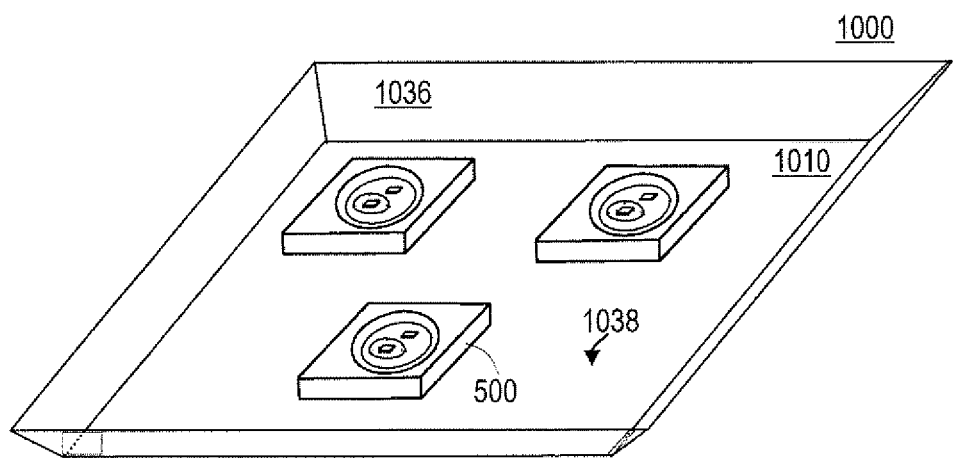
FIG. 10 illustrates an isometric view of a light module using a packaged LED similar to the light-emitting device shown in FIG. 5.

A light module may be assembled and constructed from packaged light-emitting devices. For example, in FIG. 10, a light module 1000 may comprise a substrate 1010, a plurality of light-emitting device 500, as shown in FIG. 5, a side reflective wall 1036 and a bottom reflective surface 1038. The substrate 1010 may be a PCB adapted to receive the light-emitting devices 500. The light-emitting devices 500 may be prefabricated or purchased from a supplier. The light-emitting devices 500 comprise two different wavelength-converting materials 541-542, as shown in FIG. 5, that contribute to the tunable CRI feature discussed herein above. The light-emitting devices 500 may be soldered or otherwise attached to the PCB. A portion of the substrate 1010 may be made highly reflective to define the bottom reflective surface 1038.

Figure 11:
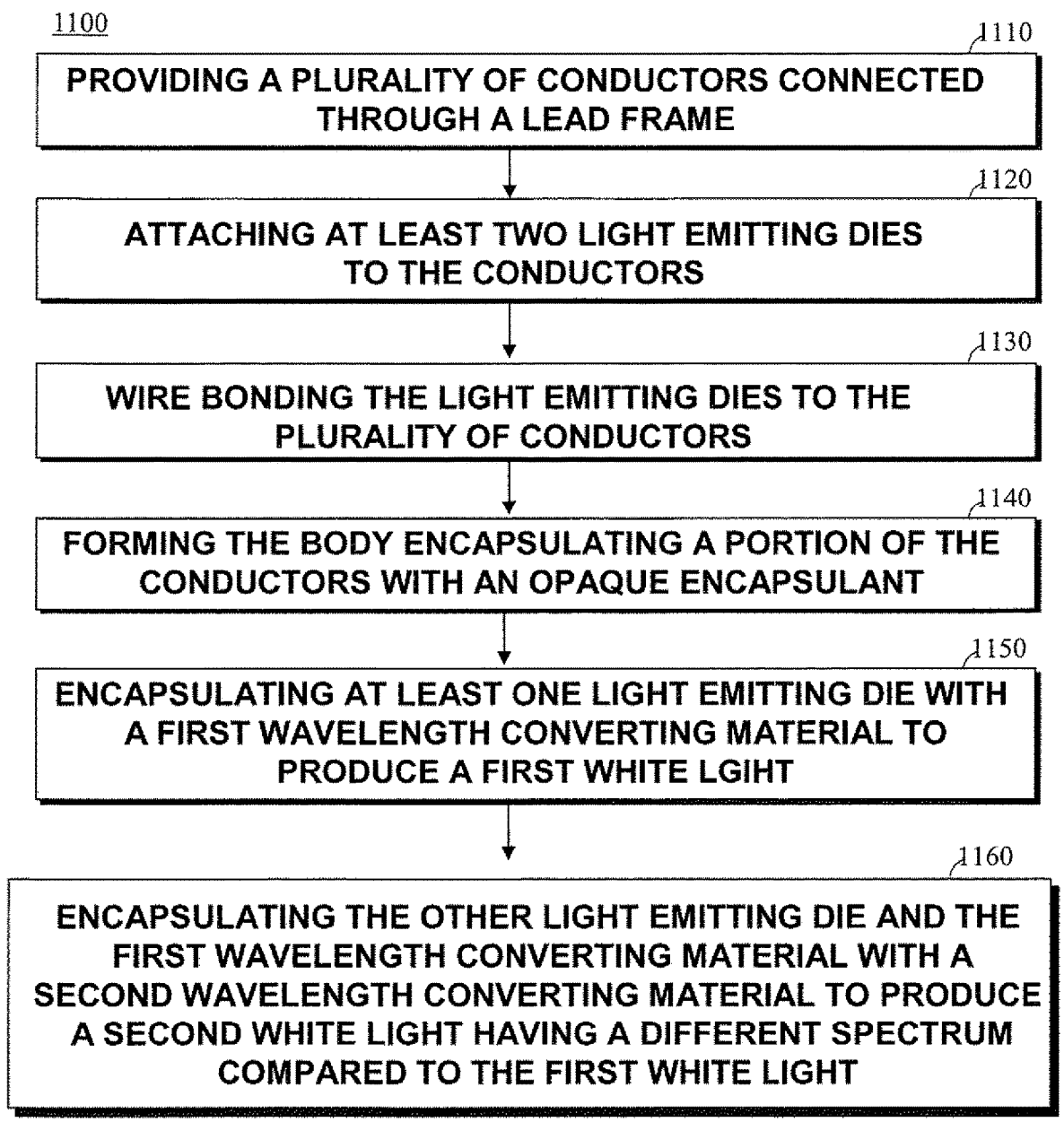
FIG. 11 illustrates a flow chart for making the light-emitting device shown in FIG. 5.

FIG. 11 shows a flow chart 1100 illustrating a method for making the light-emitting device 500 disclosed in the embodiment, shown in FIG. 5. In step 1110, a plurality of conductors connected through a lead frame are provided. The method 1100 then proceeds to step 1120, in which at least two light-emitting dies are attached to the conductors. In step 1130, the light-emitting dies go through wire bonding process to establish electrical connections between the light-emitting dies and the conductors. In step 1140, a portion of the conductors may be encapsulated with an encapsulant to form the body. This may be accomplished with a lower mold to form a lower portion of the body and an upper mold to form the upper portion of the body. In yet another embodiment, step 1140 may be performed prior to step 1120 after step 1110.

The process then proceeds to step 1150, in which at least one of the light-emitting dies may be encapsulated by a first wavelength-converting material. In step 1160, the remaining light-emitting dies and the first wavelength-converting material may be encapsulated by a second wavelength-converting material. The first and second wavelength-converting materials may comprise transparent encapsulants, such as epoxy or silicon mixed with different wavelength-converting components, such as red and yellow phosphor, respectively. Each of the wavelength-converting materials may be operable to produce visible light having different color temperature and spectral contents. The method may comprise further steps (not shown) of cutting off the conductors from the lead frame or further bending of the leads to form the leads of the packaging.

The embodiment shown in FIG. 7 may be made by using a manufacturing flow very similar to the method shown in FIG. 11, except that prior to step 1120, a hollow for receiving one of the light-emitting dies may be bent, stamped, or otherwise formed in the lead frame. Then in the next step of 1120, the light-emitting dies may be attached to the conductors, such that one of the light-emitting dies is attached on a surface of the hollow and the other light-emitting die is attached to a die attach pad outside of the hollow.

Specific embodiments of the invention have been described and illustrated herein above, the invention should not be limited to the specific forms or arrangements of parts so described and illustrated. For example, light-emitting dies described above may be one or more LED dies or some other future light source dies. Likewise, although light-emitting device with yellow and red phosphor are illustrated, the light-emitting device may contain any other wavelength-converting materials, as known or later developed without departing from the spirit of the invention. The scope of the invention is to be defined by the claims appended hereto and their equivalents.

What is claimed is:

1. A light-emitting device comprising:
    a first conductor and a second conductor that are disposed on a body;
    a pad disposed on the body and disposed between the first conductor and the second conductor;
    a first light-emitting die and a second light-emitting die that are disposed on the pad, the first light-emitting die and the second light-emitting die being configured to emit a radiation having a peak wavelength near UV light;
    a first wavelength-converting encapsulant encapsulating and directly contacting the first light-emitting die;
    first particles of a first wavelength-converting material disposed within the first wavelength-converting encapsulant, the first particles being configured to convert a first portion of the radiation emitted by the first light-emitting die into a first visible light;
    a second wavelength-converting encapsulant encapsulating and directly contacting the second light-emitting die such that only the second wavelength-converting encapsulant is encapsulating the second light-emitting die, the second wavelength-converting encapsulant further encapsulating and directly contacting the first wavelength-converting encapsulant;
    second particles of a second wavelength-converting material disposed within and throughout the second wavelength-converting encapsulant, the second particles being configured to convert a second portion of the radiation emitted by the second light-emitting die into a second visible light, a first color correlation temperature and a first spectral content of the first visible light being respectively different than a second color correlation temperature and a second spectral content of the second visible light;
    a first wire bond configured to directly connect the first light-emitting die to the first conductor; and
    a second wire bond configured to directly connect the second light-emitting die to the second conductor,
    wherein the first portion of the radiation emitted by the first light-emitting die is converted into the first visible light prior to entering the second wavelength-converting encapsulant,
    wherein the pad comprises a hollow in which the first light-emitting die and the first wavelength-converting encapsulant having the first particles of the first wavelength-converting material are disposed, and
    wherein the first light-emitting die is placed at a first position lower than the second light-emitting die, and the first wavelength-converting encapsulant is placed at a second position lower than the second wavelength-converting encapsulant.

2. The light-emitting device of claim 1, wherein the first light-emitting die and the second light-emitting die are InGaN dies.

3. The light-emitting device of claim 1, wherein the radiation emitted by the first light-emitting die has a wavelength between 300 nm and 480 nm.

4. The light-emitting device of claim 1, wherein the first wavelength-converting material comprises red phosphor.

5. The light-emitting device of claim 1, wherein the second wavelength-converting material comprises yellow phosphor.

6. The light-emitting device of claim 1, wherein a color rendering index of the light-emitting device is substantially tunable by altering a supply current to the second light-emitting die.

7. A lighting device comprising:
a substrate;
a first conductor and a second conductor that are disposed on the substrate;
a pad disposed on the substrate and disposed between the first conductor and the second conductor;
a first light-emitting die disposed on the pad, the first light-emitting die being configured to emit a first radiation having a first peak wavelength near UV light;
a first wavelength-converting encapsulant encapsulating and directly contacting the first light-emitting die;
first particles of a first wavelength-converting material disposed within the first wavelength-converting encapsulant, the first particles being configured to convert the first radiation into a first visible light having a first correlated color temperature and a first spectral content;
a second light-emitting die disposed on the pad, the second light-emitting die being configured to emit a second radiation having a second peak wavelength near the UV light;
a second wavelength-converting encapsulant encapsulating and directly contacting the second light-emitting die such that only the second wavelength-converting encapsulant is encapsulating the second light-emitting die, the second wavelength-converting encapsulant further encapsulating and directly contacting the first wavelength-converting encapsulant;
second particles of a second wavelength-converting material disposed within and throughout the second wavelength-converting encapsulant, the second particles being configured to convert the second radiation into a second visible light having a second correlated color temperature and a second spectral content, the second correlated color temperature and the second spectral content of the second visible light being respectively different than the first correlated color temperature and the first spectral content of the first visible light;
a first wire bond configured to directly connect the first light-emitting die to the first conductor; and
a second wire bond configured to directly connect the second light-emitting die to the second conductor,
wherein a portion of the first radiation is converted into the first visible light prior to entering the second wavelength-converting encapsulant,
wherein the pad comprises a hollow in which the first light-emitting die and the first wavelength-converting encapsulant having the first particles of the first wavelength-converting material are disposed, and
wherein the first light-emitting die is placed at a first position lower than the second light-emitting die, and the first wavelength-converting encapsulant is placed at a second position lower than the second wavelength-converting encapsulant.

8. The lighting device of claim 7, wherein the first light-emitting die and the second light-emitting die are InGaN dies.

9. The lighting device of claim 7, wherein each of the first radiation and the second radiation has a peak wavelength between 300 nm and 480 nm.

10. The lighting device of claim 7, wherein the first wavelength-converting material comprises red phosphor.

11. The lighting device of claim 7, wherein the second wavelength-converting material comprises yellow phosphor.

12. The lighting device of claim 7, wherein the substrate comprises a hollow area in which the first light-emitting die and the first wavelength-converting encapsulant are disposed.

13. The lighting device of claim 7, wherein a color rendering index of the lighting device is substantially tunable by altering a supply current to the second light-emitting die.

14. The lighting device of claim 7, wherein the lighting device is included in an illumination system comprising a first additional light-emitting die similar to the first light-emitting die encapsulated by the first wavelength-converting encapsulant, and a second additional light-emitting die similar to the second light-emitting die encapsulated by the second wavelength-converting encapsulant.

15. An illumination system comprising:
a substrate;
first conductors and second conductors that are disposed on the substrate; pads disposed on the substrate and disposed between respective pairs of the first conductors and the second conductors;
first light-emitting dies and second light-emitting dies respectively disposed on the pads, the first light-emitting dies and the second light-emitting dies being configured to emit radiation having a peak wavelength near UV light;
a first wavelength-converting encapsulant encapsulating and directly contacting the first light-emitting dies;
first particles of a first wavelength-converting material disposed within the first wavelength-converting encapsulant, the first particles being configured to convert the radiation emitted by the first light-emitting dies into a first visible light having a first correlated color temperature and a first spectral content;
a second wavelength-converting encapsulant encapsulating and directly contacting the second light-emitting dies such that only the second wavelength-converting encapsulant is encapsulating the second light-emitting dies, the second wavelength-converting encapsulant further encapsulating and directly contacting the first wavelength-converting encapsulant;
second particles of a second wavelength-converting material disposed and throughout within the second wavelength-converting encapsulant, the second particles being configured to convert the radiation emitted by the second light-emitting dies into a second visible light having a second correlated color temperature and a second spectral content, the second correlated color temperature and the second spectral content of the second visible light being respectively different from the first correlated color temperature and the first spectral content of the first visible light;
a first wire bond configured to directly connect the first light-emitting die to the first conductor; and
a second wire bond configured to directly connect the second light-emitting die to the second conductor,
wherein a portion of the radiation emitted by the first light-emitting dies is converted into the first visible light prior to entering the second wavelength-converting encapsulant, wherein each of the pads comprises a hollow in which a respective one of the first light-emitting dies and the first wavelength-converting encapsulant having the first particles of the first wavelength-converting material are disposed, and
wherein the first light-emitting dies are placed at a first position lower than the second light-emitting dies, and the first wavelength-converting encapsulant is placed at a second position lower than the second wavelength-converting encapsulant.

16. The illumination system of claim 15, wherein the first wavelength-converting material comprises red phosphor, and wherein the second wavelength-converting material comprises yellow phosphor.

17. The illumination system of claim 15, wherein the first light-emitting dies and the second light-emitting dies are InGaN dies.

* * * * *